United States Patent
Baur et al.

(10) Patent No.: US 7,375,377 B2
(45) Date of Patent: May 20, 2008

(54) INGAN-BASED LIGHT-EMITTING DIODE CHIP AND A METHOD FOR THE PRODUCTION THEREOF

(75) Inventors: Johannes Baur, Deuerling (DE); Georg Brüderl, Burglengenfeld (DE); Berthold Hahn, Hernau (DE); Volker Härle, Laaber (DE); Uwe Strauss, Bad Abbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/332,244

(22) PCT Filed: Jun. 13, 2001

(86) PCT No.: PCT/DE01/02190

§ 371 (c)(1),
(2), (4) Date: Aug. 28, 2003

(87) PCT Pub. No.: WO02/03479

PCT Pub. Date: Jan. 10, 2002

(65) Prior Publication Data
US 2004/0026699 A1 Feb. 12, 2004

(30) Foreign Application Priority Data
Jul. 3, 2000 (DE) .............................. 100 32 246

(51) Int. Cl.
*H01L 27/15* (2006.01)
*H01L 21/00* (2006.01)

(52) U.S. Cl. .......................... 257/79; 257/14; 257/77; 257/E51.018; 438/22; 438/105

(58) Field of Classification Search .................. 257/79, 257/117, 594, 627, 89, 86, 103, 94, 13, 14, 257/77, E33.001, E51.022, E51.018; 438/22, 438/46, 105
See application file for complete search history.

(56) References Cited

U.S. PATENT DOCUMENTS 6,121,634 A 9/2000 Saito et al.

(Continued)

FOREIGN PATENT DOCUMENTS

JP 10294532 4/1998

OTHER PUBLICATIONS

Herzog et al., "Photoluminescence microscopy of InGaN quantum wells", Appl. Phys. Lett. 70 (11), Mar. 1997.

(Continued)

*Primary Examiner*—Howard Weiss
*Assistant Examiner*—Hoa B Trinh
(74) *Attorney, Agent, or Firm*—Cohen, Pontani, Lieberman & Pavane LLP

(57) ABSTRACT

A light-emitting diode chip (1), in which over a substrate (2), a series of epitaxial layers (3) with a radiation-emitting active structure (4) based on InGaN is disposed. Between the substrate (2) and the active structure (4), a buffer layer (20) is provided. The material or materials of the buffer layer (20) are selected such that their epitaxial surface (6) for the epitaxy of the active structure (4) is unstressed or slightly stressed at their epitaxial temperature. The active structure (4) has In-rich zones (5), disposed laterally side by side relative to the epitaxial plane, in which zones the In content is higher than in other regions of the active structure (4). A preferred method for producing the chip is disclosed.

20 Claims, 2 Drawing Sheets

U.S. PATENT DOCUMENTS 6,285,698 B1 * 9/2001 Romano et al. ............... 372/46
6,984,840 B2 * 1/2006 Kuramata et al. ............ 257/11

OTHER PUBLICATIONS

Choi et al., "Fabrication of Efficient Blue Light-Emitting Diodes with InGaN/GaN Triangular Multiple Quantum Wells", Abstract.
Nakamura et al., "The Blue Laser Diode", Springer Verlag Berlin Heidelbert 1997, S. 209ff.
Harle et al., "GaN-based LEDs and lasers on SiC", Phys. Stat. Sol. (a) 180 pp. 5-13 Mar. 2000.
Monemar B., "*Optical Properties of GaN*", Semiconductors and Semimetals, vol. 50 (1998); ed. By Pankove J.I. and Moustakas T.D., pp. 305-368.
Edwards N. V. et al., "*Analysis of strain in GaN on $Al_2O_3$ and 6H-SiC near-bandedge phenomena*", Materials Research Society Symposium Proceedings vol. 395 (1996), pp. 405-410.
Gil B. et al., "*Valence-band physics and the optical properties of GaN epilayers grown onto sapphire with wurtzite symmetry*", Phys. Rev. B (1995), pp. 17028-17031.
Lambrecht W.R.L. et al., "*Electronic and optical properties of the group-III Nitrides, their heterostructures and alloys*", Materials Research Society Symposium Proceedings vol. 395 (1996), pp. 455-466.
Kim K. et al., "*Electronic structure of GaN with strain and phonon distortions*", Phys. Rev. B 50 (1994), pp. 1502-1505.
Naumov A. et al., "*Exciton recombination in $ZnSe_xTe_{1-x}/ZnTe$ QWs and $ZnSe_xTe_{1-x}$ epilayers grown by metalorganic vapour phase epitaxy*", Journal of Crystal Growth 138 (1994), pp. 595-600.
Rosenauer A. et al., "*High resolution transmission electron microscopy determination of Cd diffusion in CdSe/ZnSe single quantum well structures*", Journal of Crystal Growth 152 (1995), pp. 42-50.

* cited by examiner

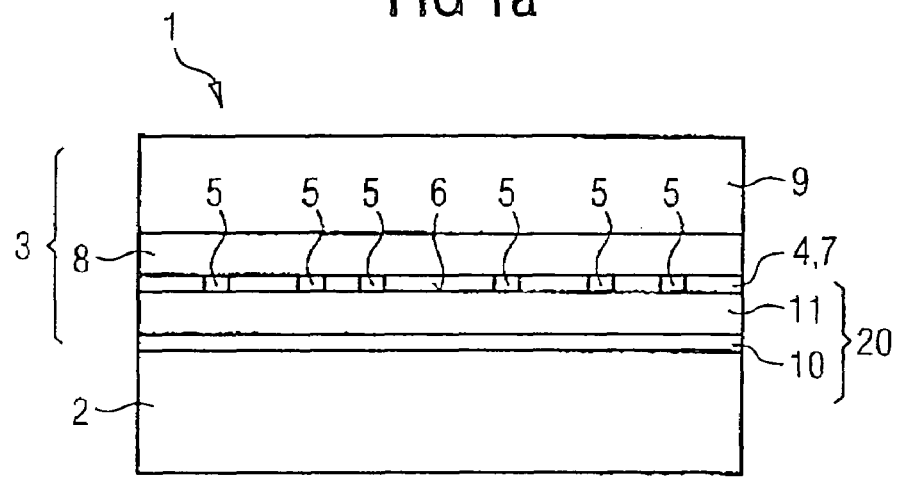
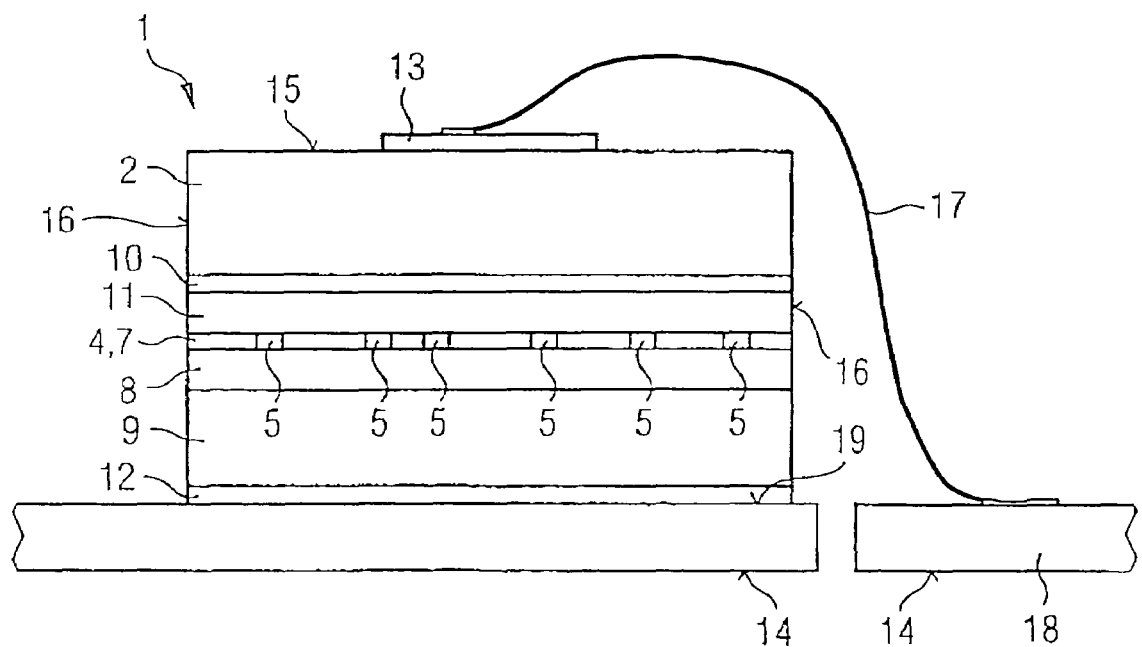

INGAN-BASED LIGHT-EMITTING DIODE CHIP AND A METHOD FOR THE PRODUCTION THEREOF

This application is a U.S. National Phase Application under 35 USC 371 of International Application PCT/DE01/02190 (not published in English) filed 13 Jun. 2001.

FIELD OF THE INVENTION

The invention relates to an InGaN-based light-emitting diode chip and to a method for producing an InGaN-based light-emitting diode chip.

BACKGROUND OF THE INVENTION

The term InGaN-based light-emitting diode chips in conjunction with the present invention is understood fundamentally to mean all light-emitting diode chips whose radiation-emitting zone has InGaN or related nitrides as well as mixed crystals based thereon, such as Ga(Al,In)N.

InGaN-based light-emitting diode chips are known for instance from The Blue Laser Diode by Shuji Nakamura and Gerhard Fasol, Springer Verlag Berlin Heidelberg 1997, page 209 ff.

SUMMARY OF THE INVENTION

An object of the invention is to make a light-emitting diode chip of the type defined at the outset available that has the highest possible radiation intensity.

This and other objects are attained in accordance with one aspect of the present invention directed to a light-emitting diode chip, having a series of epitaxial layers with a radiation-emitting active structure based on InGaN is grown on a substrate. Between the substrate and the radiation-emitting active structure is a buffer layer, comprising one or more layers. The material or materials of the buffer layer are selected such that their epitaxial surface for the epitaxy of the radiation-emitting active structure is unstressed or slightly stressed at their epitaxial temperatures. The radiation-emitting active structure has zones richer in In disposed laterally side by side relative to the epitaxial plane, in which zones the In content is higher than in other regions of the active structure.

In a preferred refinement of the light-emitting diode chip, the substrate substantially comprises electrically conductive SiC. As a result, the chip can advantageously be realized with a typical light-emitting diode chip structure, in which the contact faces are disposed on opposed sides of the chip. Consequently, current impression over a large region of the lateral chip cross section is possible in a simple way. In contrast to this, in chips with an electrically insulating substrate, the side toward the substrate of the series of epitaxial layers must be contacted from their surface. This involves markedly greater production complexity and expense, because the series of epitaxial layers, after being produced, have to be provided with etched trenches or grown in structured fashion in order to be able to contact the n-side of the active structure.

In an especially preferred refinement of the light-emitting diode chip, the active structure has a multiple-quantum-well structure, in which at least one quantum well contains the In-rich zones.

Especially preferably, the series of buffer layers has an AlGaN:Si that is a few hundred nanometers thick and is followed in the growth direction by a GaN:Si layer. The latter has a thickness between 1 μm and 3 μm. The surface of the GaN:Si layer forms the epitaxial surface for the epitaxy of the radiation-emitting epitaxial layer series and at the epitaxial temperature or epitaxial temperatures of the InGaN-based layer, it is unstressed or slightly stressed.

Another aspect of the present invention is directed to a method in which a radiation-emitting epitaxial layer series with a radiation-emitting active structure based on InGaN is deposited over a substrate. Before the epitaxy of the radiation-emitting active structure, a buffer layer or a series of buffer layers is grown on the substrate, the epitaxial surface of which layer or series, for the growth of the radiation-emitting active structure, is unstressed or slightly stressed at the epitaxial temperature or temperatures thereof.

With this method, it is advantageously achieved that the active structure has In-richer zones disposed laterally side by side relative to the epitaxial plane, in which zones the In content is higher than in other regions of the active structure.

In an especially preferred embodiment of the method, as the active structure,

As the buffer layer, preferably over the substrate first an AlGaN:Si layer a few hundred nanometers thick is deposited epitaxially, over which a GaN:Si layer is grown epitaxially. The thickness of the GaN Si:layer is between 1 μm and 3 μm, and over its surface, the radiation-emitting epitaxial layer series is deposited.

As the epitaxy method, metal-organic vapor phase epitaxy (MOVPE) is preferably suitable.

BRIEF DESCRIPTION OF THE DRAWINGS

FIG. 1a, a schematic illustration of a section through a first exemplary embodiment;

FIG. 1b, a schematic illustration of an advantageous contact design and of an advantageous way of mounting the first exemplary embodiment;

DETAILED DESCRIPTION OF THE DRAWINGS

Figure 2:
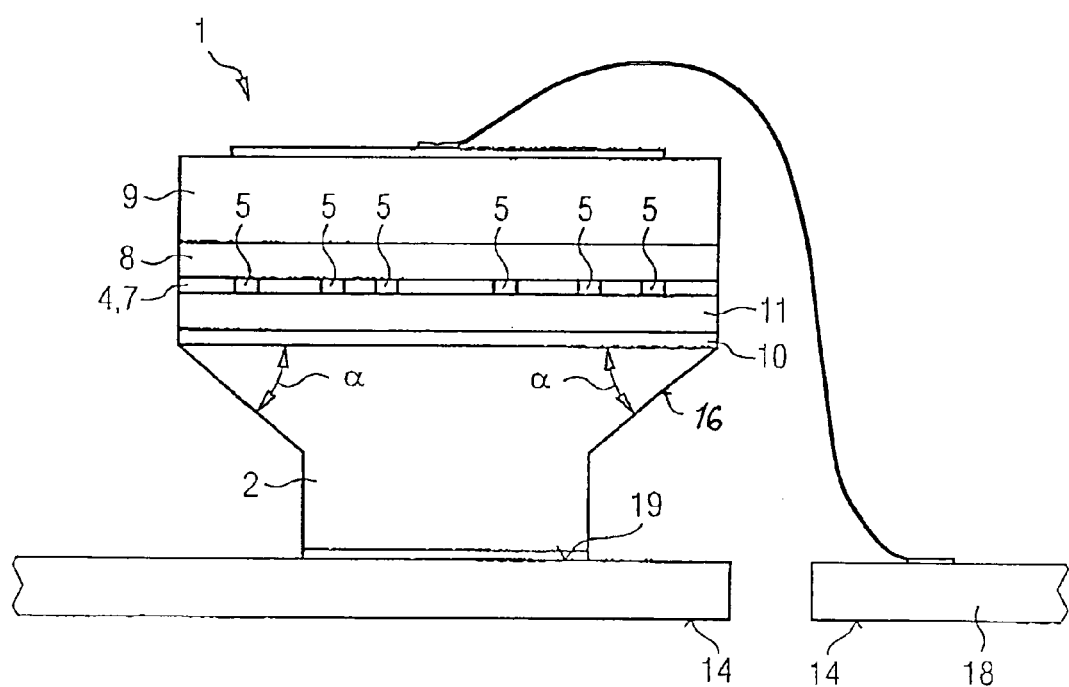
FIG. 2, a schematic illustration of a section through a second exemplary embodiment, including its advantageous type of mounting.

In the drawings of the various exemplary embodiments, components that are the same or function the same are each identified by the same reference numerals.

In the light-emitting diode chip 1 of FIG. 1a, a radiation-emitting active structure 4 is disposed over an SiC substrate 2. In the present example, this active structure has an InGaN single quantum well 7.

The radiation-emitting active structure 4 includes a plurality of In-rich zones 5, disposed laterally side by side relative to the epitaxial plane, in which zones the In content is higher than in the other regions of the active structure 4. The In content in the In-rich zones 5 is for instance up to 40%.

Over the radiation-emitting active structure 4, a thin p-conductively doped AlGaN epitaxial layer 8 and a p-conductively doped GaN layer 9 that is for instance 200 nm thick are grown.

It is equally possible for instance to provide an InGaN-based radiation-emitting active structure 4 with a double-hetero structure or a multiple-quantum-well structure (MQW) structure with a plurality of quantum wells.

The SiC substrate 2 is electrically conductive and is at least partly permeable to the radiation emitted by the epitaxial layer series 3.

Between the substrate 2 and the active structure 4 is a buffer layer 20, which contains an AlGaN:Si layer 10 a few hundred nanometers thick, which is followed in the growth direction by a GaN:Si layer 11. The GaN:Si layer 11 has a thickness between 1 µm and 3 µm, and its surface facing away from the substrate 2, in the production of the chip 1, forms the epitaxial surface 6 for the epitaxy of the InGaN-based radiation-emitting active structure 4.

In the contact design and type of mounting of the chip of FIG. 1b, which with respect to its epitaxial layer structure 3 is equivalent to the chip 1 of FIG. 1a, a bondable p-contact layer 12 is applied to the p-conductively doped GaN layer 9. This contact layer comprises Ag, or a PtAg and/or PdAg alloy, or is composed for instance of a first layer that is permeable to radiation and a reflective second layer. In the second alternative, the first layer essentially comprises Pt and/or Pd, for instance, and the second layer substantially comprises Ag, Au, and/or Al, or a dielectric mirror layer, for instance.

On its side 15 facing away from the epitaxial layer series 3, the SiC substrate 2 is provided with a contact metallization 13, which covers only part of this primary face 15 and is embodied as a bond pad for wire bonding.

The chip 1 is mounted by means of die bonding with its p-side, that is, the p-contact layer 12, on a chip mounting face 19 of an electric leadframe 14. The n-contact metallization 13 is connected via a bond wire 17 to a connection part 18 of the leadframe 14.

The light output from the chip 1 is effected via the free region of the primary face 15 of the SiC substrate 2 and via the chip edges 16.

Optionally, the chip 1 has an SiC substrate 2 that is thinned after the epitaxy of the epitaxial layer series 3. It is equally possible for the substrate 2, after the epitaxy of the epitaxial layer series 3, to be removed completely from this layer or series, creating a so-called thin-film LED.

It is understood that the chip 1 of the invention can also be mounted with its substrate side, that is, so-called "up side up" mounting, on the chip mounting face 13 of an electrical leadframe 14. The contact design should then naturally be adapted to that type of mounting. Possible materials for suitable contact metallization are known from the prior art and will therefore not be described further at this point.

The exemplary embodiment shown in FIG. 2 differs from that of FIGS. 1a and 2b essentially in that the chip edges 16 in the region below the active structure 4 are oblique to the primary direction in which the quantum well 7 extends; in the further course toward the underside, they then change over to side faces that are perpendicular again to the primary direction in which the quantum well 7 extends, so that on the one hand improved output of the radiation generated in the active zone through the side faces is attained, and on the other, reliable flip-chip mounting with conventional chip mounting systems is possible. The angle α of the regions of the side faces that are oblique to the quantum well is preferably between 20° and 80°, and an angle of approximately 30° is especially advantageous.

This chip structure of FIG. 2 is created by means of a shaping saw blade, whose end face is V-shaped and with which the epitaxy wafer, before the separation into individual chips 1, is sawn into the shape shown in FIG. 2.

In a method for producing a light-emitting component of the exemplary embodiments, first by means of metal organic gas phase epitaxy (MOVPE), the AlGaN:Si layer 10 a few hundred nanometers thick and the GaN:Si layer 11 are applied to the substrate 2. Next, the radiation-emitting active structure 4 is deposited, in which the epitaxial surface intended for it, which in the present case is formed by the free primary face of the GaN:Si layer 11, is unstressed or slightly stressed at the epitaxial temperature or temperatures of the InGaN-based structure.

Below, a comparison test of two chips 1 produced identically except for the epitaxial surface of the GaN:Si layer 11 by the method described above will be explained.

Sample 1 is a chip in which the epitaxial surface 6 is severely compressively stressed at the epitaxial temperature of the InGaN-based layer.

Conversely, in sample 2, the epitaxial surface 6 has no tension or only slight tension at the epitaxial temperature of the InGaN-based layer.

An analysis of the chips shows that the sample 1 has very smooth boundary faces between the various epitaxial layers of the series of active layers and has a homogeneous In content of approximately 15%. Conversely in sample 2, the boundary faces between the various epitaxial layers of the active layer series are very rough, and the structure has dotlike locally raised lattice constants, which correspond with locally increased In contents of up to 40%.

When mounted in a 5-mm radial structural form with a 20 mA forward current, sample 2 has a markedly increased performance over sample 1, with a simultaneous shift in the peak wavelength toward greater wavelengths.

It is understood that the explanation of the invention in terms of the above exemplary embodiments is not to be understood as a limitation to these embodiments. On the contrary, the invention can be used in particular in all light-emitting diode chips in which the active zone is based on InGaN.

The invention claimed is:

1. A light-emitting diode chip, comprising:
  a series of epitaxial layers including a radiation-emitting, InGaN-based active structure disposed over a substrate, and a buffer layer having at least one layer, the buffer layer being disposed between the substrate and the active structure,
  wherein material forming the buffer layer is such that an epitaxial surface thereof for epitaxy of the active structure is unstressed or slightly stressed at their epitaxial temperature, the epitaxial surface for epitaxy of the active structure being on the buffer layer, and
  wherein the active structure has In-rich zones disposed laterally side by side in a plane which is parallel to said epitaxial surface, and wherein an In content in the In-rich zones is higher than in other regions of the active structure.

2. The light-emitting diode chip of claim 1, wherein the substrate substantially comprises SiC.

3. The light-emitting diode chip of claim 1, wherein the active structure has a single-quantum-well structure or a multiple-quantum-well structure that contains the In-rich zones.

4. The light-emitting diode chip of claim 1, wherein the buffer layer comprises a series of buffer layers including an AlGaN:Si layer and a GaN:Si layer located downstream thereof in a direction of growth, the GaN:Si layer having a thickness of between 1 µm and 3 µm and a surface that forms the epitaxial surface for epitaxy of the active structure.

5. A method for producing an InGaN-based light-emitting component by depositing on a substrate a series of epitaxial layers which include a radiation-emitting InGaN-based active structure and a buffer layer, wherein the method comprises the steps of:
  selecting material forming the buffer layer such that an epitaxial surface of the buffer layer for epitaxy of the radiation-emitting active structure is unstressed or slightly stressed at their epitaxial temperatures;

epitaxially growing the buffer layer over the substrate from said selected material; and epitaxially growing the active structure over said epitaxial surface of the buffer layer, wherein said active structure has In-rich zones disposed laterally side by side in a plane which is parallel to said epitaxial surface, and wherein an In content in the In-rich zones is higher than in other regions of the active structure.

6. The method of claim 5, wherein the active structure comprises a multiple-quantum-well structure having an InGaN quantum well.

7. The method of claim 5, wherein the substrate comprises SiC.

8. The method of claim 5, wherein the method comprises the steps of:

forming the buffer layer by
 a. forming an AlGaN:Si layer having a thickness of a few hundred nanometers over the substrate, and
 b. forming a GaN:Si layer having a thickness of between 1 µm and 3 µm over the AlGaN:Si layer; and in said step of forming the radiation-emitting active structure, said active structure is formed on a surface of the GaN:Si layer.

9. The method of claim 6, wherein the method comprises the steps of:

forming the buffer layer by
 a. forming an AlGaN:Si layer having a thickness of a few hundred nanometers over the substrate, and
 b. forming a GaN:Si layer having a thickness of between 1 µm and 3 µm over the AlGaN:Si layer; and in said step of forming the radiation-emitting active structure, said active structure is formed on a surface of the GaN:Si layer.

10. The method of claim 7, wherein the method comprises the steps of:

forming the buffer layer by
 a. forming an AlGaN:Si layer having a thickness of a few hundred nanometers over the substrate, and
 b. forming a GaN:Si layer having a thickness of between 1 µm and 3 µm over the AlGaN:Si layer; and in said step of forming the radiation-emitting active structure, said active structure is formed on a surface of the GaN:Si layer.

11. The light-emitting diode chip of claim 2, wherein the buffer layer comprises a series of buffer layers including an AlGaN:Si layer and a GaN:Si layer located downstream thereof in a direction of growth, the GaN:Si layer having a thickness of between 1 µm and 3 µm and a surface that forms the epitaxial surface for epitaxy of the active structure.

12. The light-emitting diode chip of claim 3, wherein the buffer layer comprises a series of buffer layers including an AlGaN:Si layer and a GaN:Si layer located downstream thereof in a direction of growth, the GaN:Si layer having a thickness of between 1 m and 3 µm and a surface that forms the epitaxial surface for epitaxy of the active structure.

13. The light-emitting diode chip of claim 2, wherein the active structure has a single-quantum-well structure or a multiple-quantum-well structure that contains the In-rich zones.

14. The method of claim 6, wherein the substrate comprises SiC.

15. The light-emitting diode chip of claim 1, wherein the epitaxial surface of the buffer layer is un-etched.

16. The light-emitting diode chip of claim 1, wherein the epitaxial surface of the buffer layer is free from grooves.

17. The light-emitting diode chip of claim 1, wherein the epitaxial surface of the buffer layer is essentially flat.

18. The light-emitting diode chip of claim 1, wherein the epitaxial surface of the buffer layer is free from etched structures.

19. The light-emitting diode chip of claim 1, wherein the epitaxial surface of the buffer layer is essentially free from grooves.

20. The light-emitting diode chip of claim 1, wherein the light-emitting diode is arranged in the following sequence of layers comprising:

the substrate substantiality comprising SiC;

an AlGaN:Si layer which is in direct contact with the substrate;

a GaN:Si layer which is in direct contact with the AlGaN:Si layer; and the active structure which is in direct contact with the GaN:Si layer.

* * * * *

UNITED STATES PATENT AND TRADEMARK OFFICE
CERTIFICATE OF CORRECTION

PATENT NO.          : 7,375,377 B2                                          Page 1 of 1
APPLICATION NO.  : 10/332244
DATED                  : May 20, 2008
INVENTOR(S)         : Johannes Baur It is certified that error appears in the above-identified patent and that said Letters Patent is hereby corrected as shown below:

--(75) Inventors:    Johannes Baur, Deuerling (DE):
        Georg Brüderl, Burglengenfeld (DE); Berthold Hahn,
        ~~Hernau~~ Hemau (DE); Volker Härle, Laaber (DE):
        Uwe Strauss, Bad Abbach (DE)--

Signed and Sealed this

Tenth Day of November, 2009

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,375,377 B2 | Page 1 of 1 |
| APPLICATION NO. | : 10/332244 | |
| DATED | : May 20, 2008 | |
| INVENTOR(S) | : Johannes Baur | |

It is certified that error appears in the above-identified patent and that said Letters Patent is hereby corrected as shown below:

On the Title Page:

Item (73) Assignee:     ~~Osram Opto Semiconductors GmbH~~ should read:     --<u>Osram GmbH</u>
                          Regensburg(DE)--

Signed and Sealed this
Fourteenth Day of February, 2012

David J. Kappos
*Director of the United States Patent and Trademark Office*